(12) United States Patent
Deligianni et al.

(10) Patent No.: US 9,654,004 B1
(45) Date of Patent: May 16, 2017

(54) 3D INTEGRATED DC-DC POWER CONVERTERS

(71) Applicant: International Business Machines Corporation, Armonk, NY (US)

(72) Inventors: Hariklia Deligianni, Alpine, NJ (US); Devendra K. Sadana, Pleasantville, NY (US); Edmund J. Sprogis, Myrtle Beach, SC (US); Naigang Wang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/185,723

(22) Filed: Jun. 17, 2016

(51) Int. Cl.
| | | |
|---|---|---|
| H01L 21/4763 | (2006.01) | |
| H02M 3/158 | (2006.01) | |
| H01L 29/20 | (2006.01) | |
| H01L 29/205 | (2006.01) | |
| H01L 29/778 | (2006.01) | |
| H01L 23/498 | (2006.01) | |
| H01L 23/31 | (2006.01) | |
| H01L 29/66 | (2006.01) | |

(Continued)

(52) U.S. Cl.
CPC .......... *H02M 3/158* (2013.01); *H01L 21/486* (2013.01); *H01L 21/4853* (2013.01); *H01L 21/565* (2013.01); *H01L 21/8221* (2013.01); *H01L 23/3114* (2013.01); *H01L 23/49811* (2013.01); *H01L 23/49827* (2013.01); *H01L 23/49838* (2013.01); *H01L 27/0688* (2013.01); *H01L 28/10* (2013.01); *H01L 29/2003* (2013.01); *H01L 29/205* (2013.01); *H01L 29/66462* (2013.01); *H01L 29/7787* (2013.01)

(58) Field of Classification Search
None
See application file for complete search history.

(56) References Cited

U.S. PATENT DOCUMENTS

| | | |
|---|---|---|
| 7,238,992 B2 | 7/2007 | Komori et al. |
| 7,772,055 B2 | 8/2010 | Germain et al. |

(Continued)

FOREIGN PATENT DOCUMENTS

WO    WO2010001336 A1    1/2010

OTHER PUBLICATIONS

Morita al., "GaN Gate Injection Transistor with Integrated Si Schottky Barrier Diode for Highly Efficient DC-DC Converters," 2012 IEEE International Electron Devices Meeting (IEDM), pp. 7.2.1-7.2.4 (Dec. 2012).

(Continued)

*Primary Examiner* — Jack Chen
(74) *Attorney, Agent, or Firm* — Vazken Alexanian; Michael J. Chang, LLC (57) ABSTRACT

Techniques for integrating DC-DC power converters with other on-chip circuitry are provided. In one aspect, an integrated DC-DC power converter includes: a GaN transistor chip having at least one GaN switch formed thereon; an interposer chip, bonded to the GaN transistor chip, having at least one power driver transistor formed thereon; TSVs present in the interposer chip adjacent to the power driver transistor and which connect the power driver transistor to the GaN switch; and an on-chip magnetic inductor formed either on the GaN transistor chip or on the interposer chip. A method of forming a fully integrated DC-DC power converter is also provided.

10 Claims, 12 Drawing Sheets

(51) Int. Cl.
H01L 21/48 (2006.01)
H01L 21/56 (2006.01)
H01L 27/06 (2006.01)
H01L 21/822 (2006.01)
H01L 49/02 (2006.01)

(56) References Cited

U.S. PATENT DOCUMENTS

| | | |
|---|---|---|
| 7,973,633 B2 | 7/2011 | Noma et al. |
| 8,338,933 B2 | 12/2012 | Chen et al. |
| 8,674,670 B2 | 3/2014 | Briere et al. |
| 9,147,701 B2 | 9/2015 | Saunders |
| 2010/0328010 A1* | 12/2010 | Noma .................. H02M 1/44 336/200 |

OTHER PUBLICATIONS

Andry et al., "A CMOS-compatible Process for Fabricating Electrical Through-vias in Silicon," Proceedings of the 56th Electronic Components and Technology Conference (Feb. 2006) (9 pages).
Zhuang et al., "Study of Magnetic On-Chip Inductors," Proc. SAFE 2001, Nov. 28-29, 2001, Veldhoven, the Netherlands, pp. 229-233.

* cited by examiner

3D INTEGRATED DC-DC POWER CONVERTERS

FIELD OF THE INVENTION

The present invention relates to direct current (DC)-DC power converters, and more particularly, to techniques for integrating DC-DC power converters with other on-chip circuitry.

BACKGROUND OF THE INVENTION

A switched-inductor power converter is the most widely used DC-DC power converter topology in power electronics due to its high efficiency and power-handling ability. A Buck DC-DC power converter can be used to step down voltage from its input/supply to its output/load. Thus Buck converters are also referred to as step-down converters. In a Buck converter, an inductor is used to store energy and two switches are used to control the currents flowing in the inductors.

It is desirable for DC-DC power converters to work at high voltages (e.g., greater than 20 volts (V), high power density, and high frequencies (e.g., greater than 10 megahertz (MHz)), while at the same time, achieve high levels of integration for efficient power delivery and fast transient response. Currently, the switches for DC-DC power converter are usually silicon-devices, e.g., complementary metal-oxide semiconductor (CMOS) for low voltage (e.g., less than 5V) and discrete silicon (Si)-trench devices for higher voltage (up to 50V). However, Si devices have high on-resistance (Ron) and gate capacitance (Cg), and therefore it is challenging for these devices to achieve high switching frequency and high power density. At the same time, low frequency requires larger passive devices (e.g., inductors), the consequences of which are larger converter size and slow transient response.

High-electron-mobility-transistors (HEMTs), such as gallium nitride (GaN) transistors, have high breakdown voltage, low on-resistance, and high operation temperature, which makes them ideal candidates to replace silicon switches for high power, high voltage Buck converters. Meanwhile, on-chip magnetic inductors (closed yoke inductors or solenoidal inductors) can provide the dense energy storage required for integrated power converters to achieve the high level integration for high efficiency power delivery and fast transient response.

Currently, the GaN-switch-based power converters use discrete parts, such as a GaN switch chip, a Si CMOS chip and discrete inductors, then all the parts assembled on a printed circuit Board. This non-integrated structure has a big size, has large parasitics, limited switching frequency, and low efficiency.

Thus, integrated power converter designs would be desirable.

SUMMARY OF THE INVENTION

The present invention provides techniques for integrating DC-DC power converters with other on-chip circuitry. In one aspect of the invention, an integrated DC-DC power converter is provided. The integrated DC-DC power converter includes: a gallium nitride (GaN) transistor chip having at least one GaN switch formed thereon; an interposer chip, bonded to the GaN transistor chip, having at least one power driver transistor formed thereon; through-silicon vias (TSVs) present in the interposer chip adjacent to the power driver transistor and which connect the power driver transistor to the GaN switch; and an on-chip magnetic inductor formed either on the GaN transistor chip or on the interposer chip.

In one aspect of the invention, a method of forming a fully integrated DC-DC power converter is provided. The method includes the steps of: forming at least one power driver transistor on an interposer chip; forming TSVs in the interposer chip adjacent to the power driver transistor; forming at least one GaN switch on a GaN transistor chip; forming an on-chip magnetic inductor either on the GaN transistor chip or on the interposer chip; and bonding the interposer chip to the GaN transistor chip.

A more complete understanding of the present invention, as well as further features and advantages of the present invention, will be obtained by reference to the following detailed description and drawings.

DETAILED DESCRIPTION OF PREFERRED EMBODIMENTS

Provided herein are integrated, on-chip DC-DC power converter structures with fully integrated GaN switches, on-chip magnetic inductors, and CMOS power drivers. In particular, CMOS transistors are integrated on a Si through silicon via (TSV) interposer, which is then bonded to a GaN chip in order to complete a compact DC-DC power converter. The magnetic inductors are built on either the interposer or the GaN chip. Some notable advantages of the present techniques include: smaller converter size, high efficiency (smaller $R*I^2$ loss from interconnect and bonding wires, wherein R is resistance and I is current), low noise (smaller parasitics from interconnect and bonding wires), fast transient response, and low cost.

Figure 1:
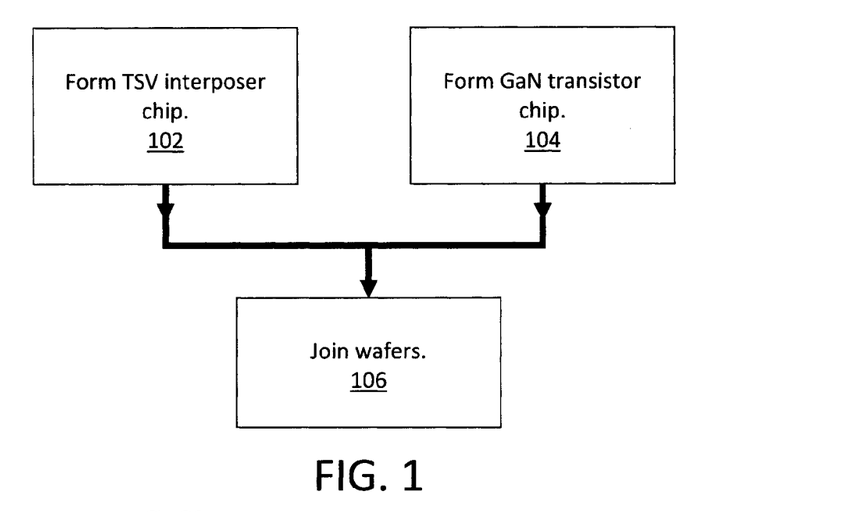
FIG. 1 is a diagram illustrating an overview of the present techniques for forming a fully integrated DC-DC power converter according to an embodiment of the present invention.

Several exemplary embodiments will now be described for forming fully integrated DC-DC power converters in which wafer bonding processes are used to integrate a TSV interposer chip and a GaN transistor chip. In each of the following process flows, the steps for forming the TSV interposer chip are described, followed by the steps for forming the GaN transistor chip, and then finally the particular wafer bonding processes used to integrate the chips. This is done to clearly illustrate the various steps involved in each process. However, this does not imply that the steps be performed in the particular order described. For instance, one or more of the steps may be performed in a different order than presented and/or two or more steps may be performed simultaneously. For instance, simultaneous processes may be employed to form the TSV interposer and GaN transistor chips, followed by wafer bonding of the chips that have been formed. Accordingly, FIG. 1 provides a general overview of the present process flows. In step 102, the TSV interposer chip is fabricated. In step 104, the GaN transistor chip is fabricated. In step 106, the TSV interposer chip and the GaN transistor chip are bonded together, and any subsequent processing (such as removal of a handle wafer, packaging, etc.) can be performed. See below.

A first exemplary embodiment is now described by way of reference to FIGS. 2-13. In this example, bump interconnects are used to join the wafers, and the magnetic inductor is included on the TSV interposer chip.

Figure 2:
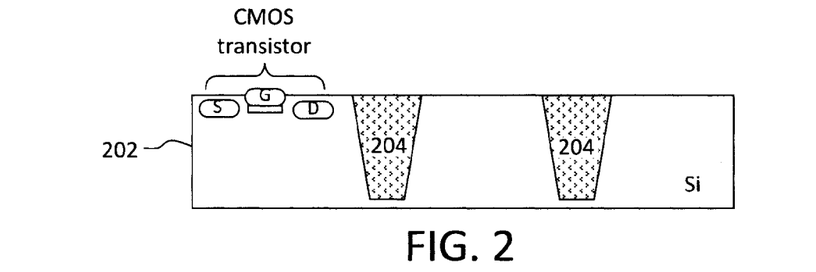
FIG. 2 is a cross-sectional diagram illustrating CMOS transistors and TSVs having been formed in a TSV interposer chip according to an embodiment of the present invention.

To begin fabrication of the TSV interposer chip, the process begins as shown in FIG. 2, with a Si substrate 202 in which one or more CMOS transistors are formed using standard front-end-of-line (FEOL) processes. These transistors will serve as the CMOS power drivers in the completed integrated power converter. For illustrative purposes only, a single power driver transistor is shown in the figures. Each transistor generally includes a source (S), a drain (D), and a gate (G).

One or more insulated TSVs 204 are then formed in the Si substrate 202. See FIG. 2. The process for forming insulated TSVs in a semiconductor substrate is generally known to include via etching, sidewall insulation, and metallization. See, for example, Andry et al., "A CMOS-compatible Process for Fabricating Electrical Through-vias in Silicon," Proceedings of the 56$^{th}$ Electronic Components and Technology Conference (February 2006) (9 pages) (hereinafter "Andry"), the contents of which are incorporated by reference as if fully set forth herein. The sidewall insulation, e.g., thermally grown oxide (see Andry), insulates the TSV from the substrate 202.

Figure 3:
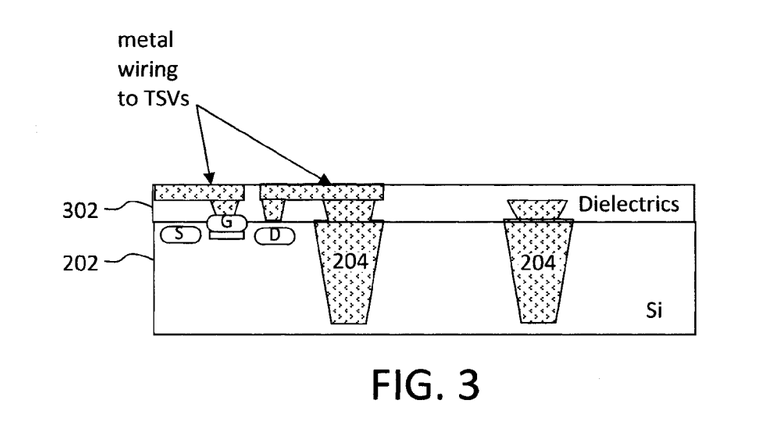
FIG. 3 is a cross-sectional diagram illustrating wiring having been fabricated to connect the TSVs with the CMOS transistors according to an embodiment of the present invention.
Figure 4:
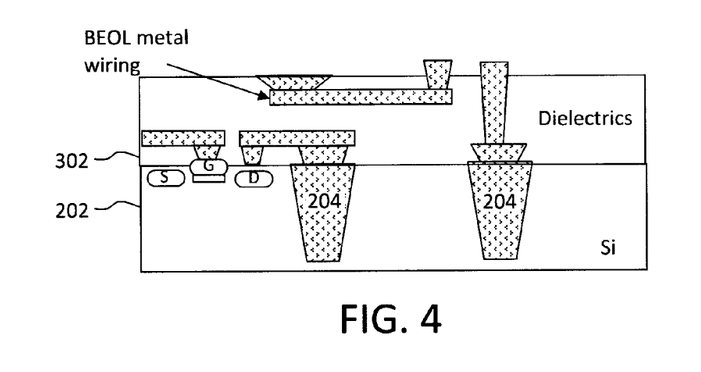
FIG. 4 is a cross-sectional diagram illustrating back-end-of-line (BEOL) metal wiring having been formed according to an embodiment of the present invention.
Figure 5:
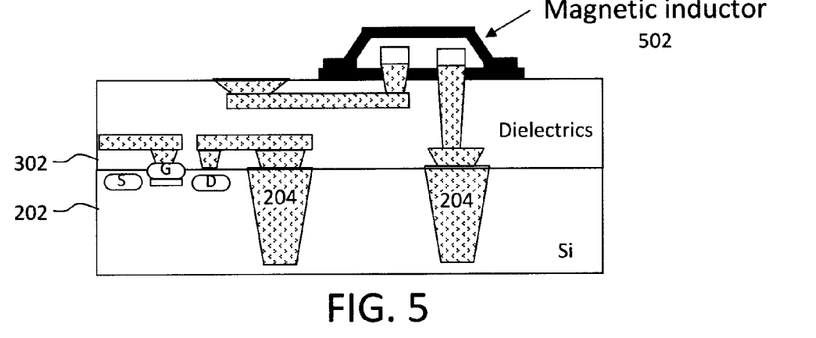
FIG. 5 is a cross-sectional diagram illustrating a magnetic inductor having been built on the TSV interposer chip according to an embodiment of the present invention.

Next, wiring is fabricated to connect the TSVs 204 with the CMOS transistors. See FIG. 3. Standard metallization processes may be used to form the metal wiring. For instance, as shown in FIG. 3, a dielectric(s) 302 can be deposited onto the wafer, covering the CMOS transistors and the TSVs, patterned, and the pattern filled with a suitable conductor (e.g., copper (Cu)) to form the wires. While dielectric 302 is shown as a single layer, one skilled in the art would recognize that multiple layers of dielectric may be needed to bury the various metal wiring layers.

A back-end-of-line process can be used for completing the TSV interposer chip metallization. See FIG. 4. In the same manner as described above, a metallization pattern can be created in the dielectric 302 and filled with a suitable conductor to form the respective metal wires. This metal wiring as shown formed in FIG. 4 will, among other things, connect the GaN switches to a magnetic inductor.

In this particular example, the magnetic inductor 502 for the integrated DC-DC power converter is built on the TSV interposer chip. See FIG. 5. A switched mode DC-DC power converter converts DC voltage from one level to another by storing the input energy temporarily, and then releasing that energy at a different voltage. The storage and release may be made from a magnetic field of the magnetic inductor. In the example depicted in the figures, the magnetic inductor has a closed-yoke design. An exemplary process for forming a closed-yoke magnetic inductor is described in detail below.

Figure 6:
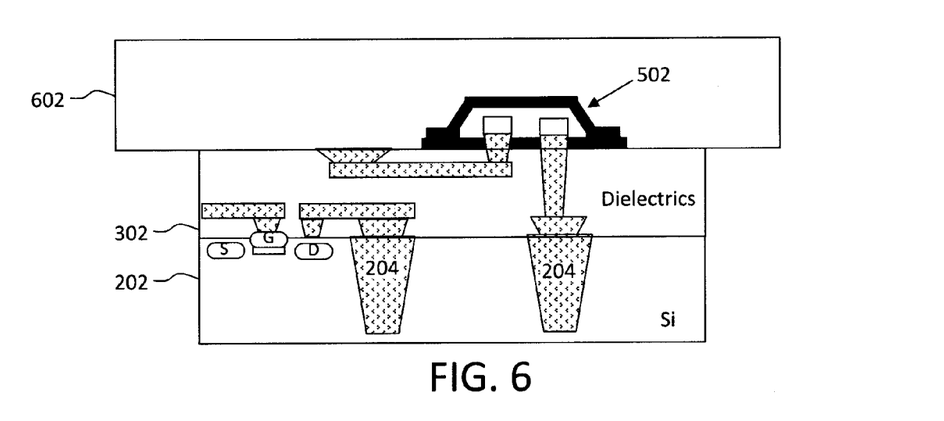
FIG. 6 is a cross-sectional diagram illustrating a first temporary handle wafer having been attached to the front side of the TSV interposer chip according to an embodiment of the present invention.
Figure 7:
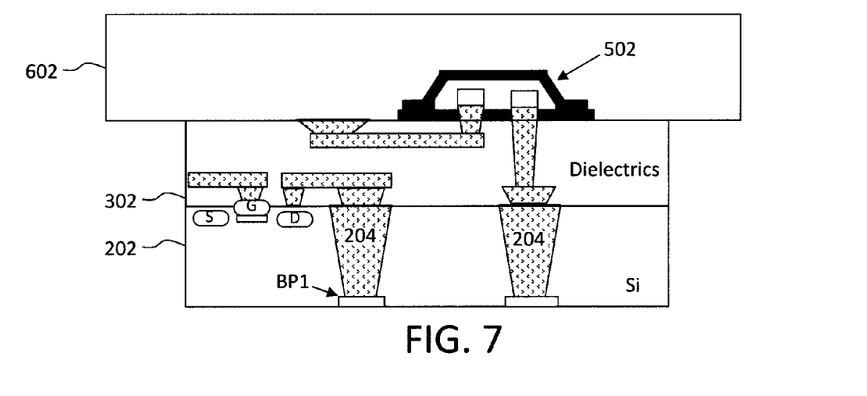
FIG. 7 is a cross-sectional diagram illustrating the TSVs having been exposed on the backside of the chip and a first set of bond pads (BP1) having been built to the TSVs according to an embodiment of the present invention.
Figure 8:
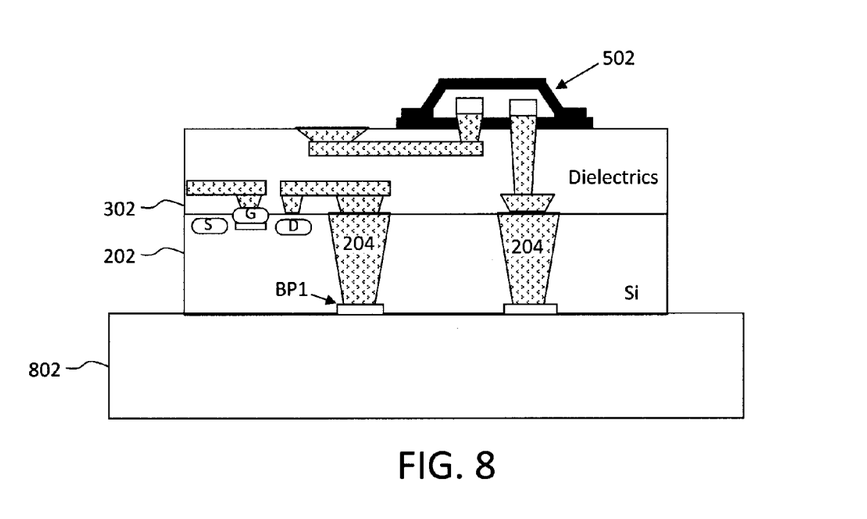
FIG. 8 is a cross-sectional diagram illustrating a second temporary handle wafer having been attached to the front side of the TSV interposer chip, and the first temporary handle wafer having been removed according to an embodiment of the present invention.

In order to enable processing of the backside of the TSV interposer chip, a temporary handle wafer 602 can be attached to the front side of the chip as shown in FIG. 6. Specifically, as shown in FIG. 7, use of the handle wafer permits a back side etch to be used to expose the TSVs 204, and a first set of bond pads (labeled "BP1") to be built in contact with the TSVs 204. By way of example only, the bond pads can be formed from a suitable metal such as Cu. As will be described in detail below, these bond pads, along with the corresponding bond pads on the GaN transistor chip (BP2—see below) will be used to integrate the two chips via solder bond between the pads.

Figure 9:
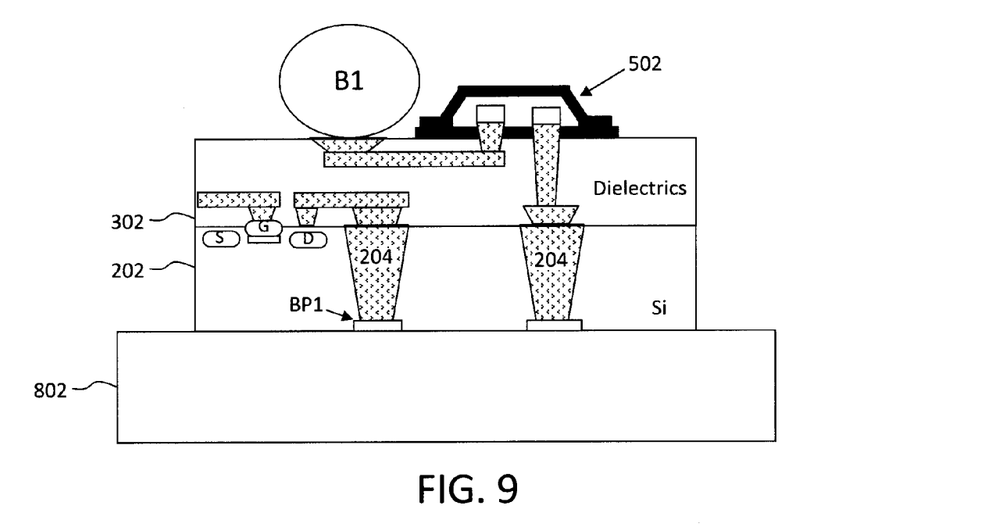
FIG. 9 is a cross-sectional diagram illustrating a bump interconnect (B1) having been fabricated on the front side of the TSV interposer chip according to an embodiment of the present invention.

In the same general manner, a temporary handle wafer 802 is attached to the front side of the TSV interposer chip and the temporary handle wafer 602 is removed. See FIG. 8. As shown in FIG. 9, this second temporary handle wafer 802 permits fabrication of bump interconnects (labeled "B1") on the front side of the TSV interposer chip which will serve as a link to the device package (see below). Following formation of the bump interconnects, the second temporary handle wafer 802 can also be removed.

Figure 10:
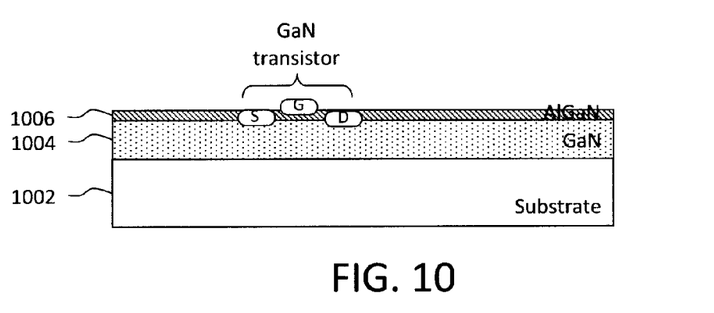
FIG. 10 is a cross-sectional diagram illustrating at least one GaN transistor having been formed on the GaN transistor chip according to an embodiment of the present invention.

To begin fabrication of the GaN transistor chip, the process begins as shown in FIG. 10, with a substrate 1002 and an active layer on the substrate in which one or more GaN transistors (i.e., switches) are formed. Suitable techniques for forming a GaN transistor are described generally, for example, in U.S. Pat. No. 7,772,055 issued to Germain et al., entitled "AgGaN High Electron Mobility Transistor Devices" (hereinafter "U.S. Pat. No. 7,772,055"), the contents of which are incorporated by reference as if fully set forth herein. The GaN transistors generally include as the active materials a layer of GaN 1004 on the substrate 1002, and a higher band gap material (than GaN) 1006 on the GaN layer 1004. See FIG. 10. According to an exemplary embodiment, the high band gap material 1006 is aluminum gallium nitride (AlGaN). As described, e.g., in U.S. Pat. No. 7,772,055, these layers 1004 and 1006 can be formed on the substrate 1002 using a vapor phase epitaxy process with trimethylgallium, trimethyl ammonium, ammonia, and silane as precursors. Suitable substrates 1002 include, but are not limited to, Si (111), silicon carbide (SiC), or sapphire substrates.

Figure 11:
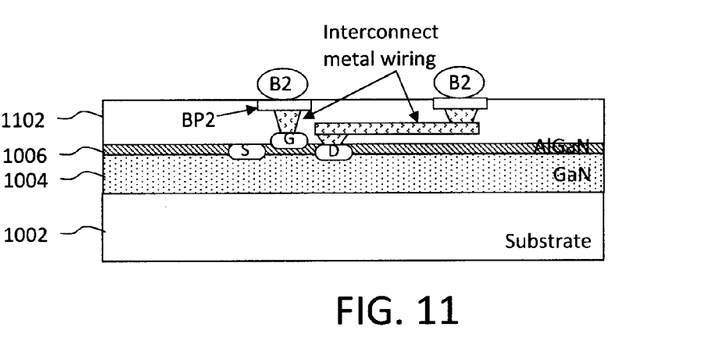
FIG. 11 is a cross-sectional diagram illustrating interconnect metal wiring having been formed to the GaN transistors, a second set of bond pads (BP2) having been formed to the interconnect metal wiring, and a second set of bump interconnects (B2) having been formed on the bond pads BP2 according to an embodiment of the present invention.

As described above, each transistor will have a source (S), a drain (D), and a gate (G), which in this example are formed on the active layers 1004 and 1006. See FIG. 10. In the same general manner as described above, interconnect metal wiring is formed to the GaN transistors/switches which involves depositing a dielectric(s) 1102 on the wafer over the GaN transistors, forming a metallization pattern in the dielectric 1102, and then filling the pattern with a suitable metal such as Cu. See FIG. 11. As shown in FIG. 11, a second set of bond pads (labeled "BP2") are then formed to the interconnect metal wiring, and a (second) set of bump interconnects (labeled "B2") are formed on the bond pads BP2. These bump interconnects B2 will serve to join the first set of bond pads BP1 (on the TSV interposer chip) to the second set of bond pads BP2 (on the GaN transistor chip)—see below.

Figure 12:
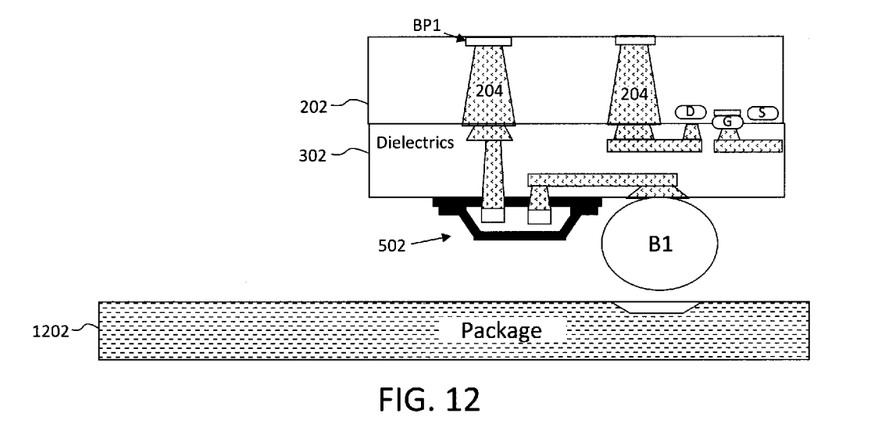
FIG. 12 is a cross-sectional diagram illustrating the TSV interposer chip having been joined to a package via the bump interconnect B1 according to an embodiment of the present invention.
Figure 13:
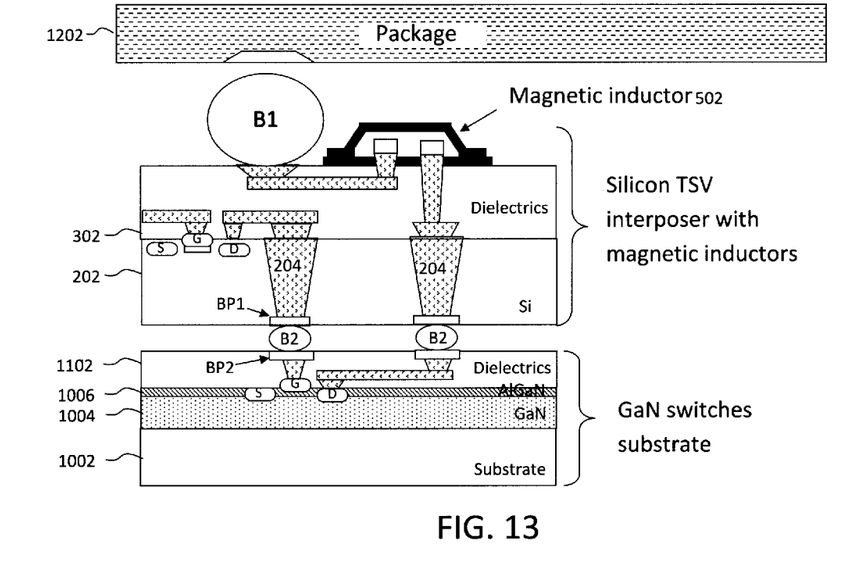
FIG. 13 is a cross-sectional diagram illustrating the TSV interposer chip/package having been joined to the GaN transistor chip via bump interconnects B2 according to an embodiment of the present invention.

A flip-chip process is then employed to 1) join the TSV interposer chip with a chip package, and 2) integrate the TSV interposer chip with the GaN transistor chip. Namely, as shown in FIG. 12, the TSV interposer chip is first joined to the package 1202 via the bump interconnect B1. By "flip-chip" it implies that the chip is flipped for bonding, e.g., back to back, front side to back, front to front, etc. to another chip or structure. Next, as shown in FIG. 13, the TSV interposer chip/package is then joined to the GaN transistor chip via bump interconnects B2.

It is also possible to build the on-chip magnetic inductors on the GaN transistor chip rather than on the TSV interposer chip. See, for example, FIGS. 14-17 which illustrate a second exemplary embodiment of the present techniques. The same basic steps as above are performed to fabricate the TSV interposer chip and the GaN transistor chip, except that in this case a magnetic inductor is formed on the GaN transistor chip.

Figure 14:
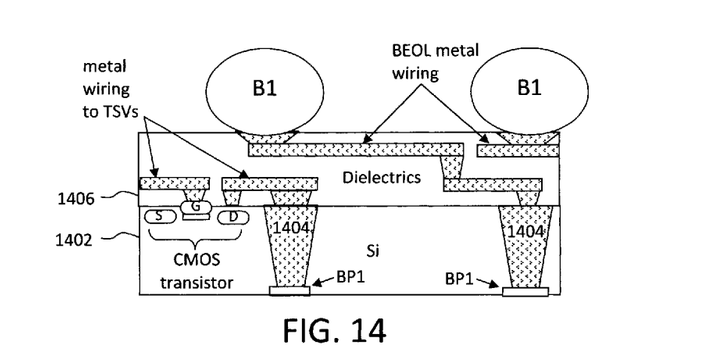
FIG. 14 is a cross-sectional diagram illustrating, according to another exemplary embodiment, a TSV interposer chip having been fabricated according to an embodiment of the present invention.

Namely, regarding the TSV interposer chip, as shown in FIG. 14, at least one CMOS transistor (i.e., power driver) is fabricated on a Si substrate 1402 (using standard FEOL processes), and insulated TSVs 1404 are fabricated in the substrate 1402 adjacent to the CMOS transistor(s). The CMOS transistor(s) and TSVs are covered in a dielectric(s) 1406 and metal wiring is formed that connects the TSVs and the CMOS transistors. BEOL metal wiring is also formed at this stage.

In the same manner as described above, a series of temporary handle wafers are used to, in turn, 1) (via a first temporary handle wafer—not shown) permit back side processing of the TSV interposer chip enabling formation of a first set of bond pads (BP1) to the TSVs, and 2) (via a second temporary handle wafer—not shown) permit fabrication of bump interconnects (B1) on a front side of the TSV interposer chip. As described above, the first temporary handle wafer is removed after application of the second temporary handle wafer, and the second temporary handle wafer is removed after fabrication of the bump interconnects (B1). As will be described in detail below, the first set of bond pads (BP1) will be used in bonding the TSV interposer chip to the GaN transistor chip, while the bump interconnects (B1) will link the integrated power converter to a chip package.

Figure 15:
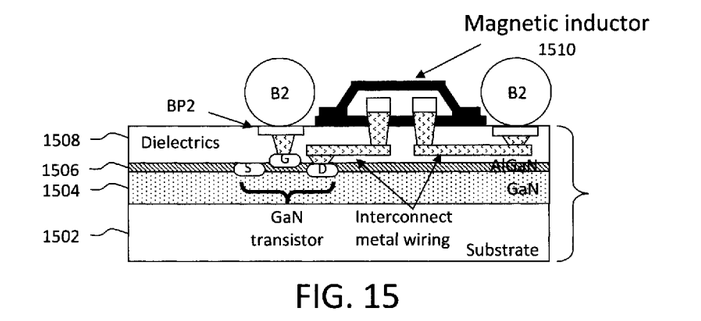
FIG. 15 is a cross-sectional diagram illustrating a GaN transistor chip having been fabricated according to an embodiment of the present invention.

Regarding the GaN transistor chip the process, as described in detail above, begins with a suitable substrate 1502 (e.g., Si (111), SiC, or sapphire) on which active layers such as a GaN layer 1504 and a higher band gap material 1506 (e.g., AlGaN) are deposited. See FIG. 15. As shown in FIG. 15, at least one GaN transistor (switch) is formed on the active layers.

The GaN transistor is covered in a dielectric(s) 1508 and interconnect metal wiring is formed to the GaN transistor. BEOL metal wiring is also formed. At this point in the process, one point of departure from the first exemplary embodiment above, is that the magnetic inductor 1510 for the integrated DC-DC power converter is now built on the GaN transistor chip. In the example depicted in the figures, the magnetic inductor has a closed-yoke design. An exemplary process for forming a closed-yoke magnetic inductor is described in detail below.

Finally, a second set of bond pads (BP2) are then formed to the interconnect metal wiring, and a (second) set of bump interconnects (B2) are formed on the bond pads BP2. These bump interconnects B2 will serve to join the first set of bond pads BP1 (on the TSV interposer chip) to the second set of bond pads BP2 (on the GaN transistor chip)—see below.

Figure 16:
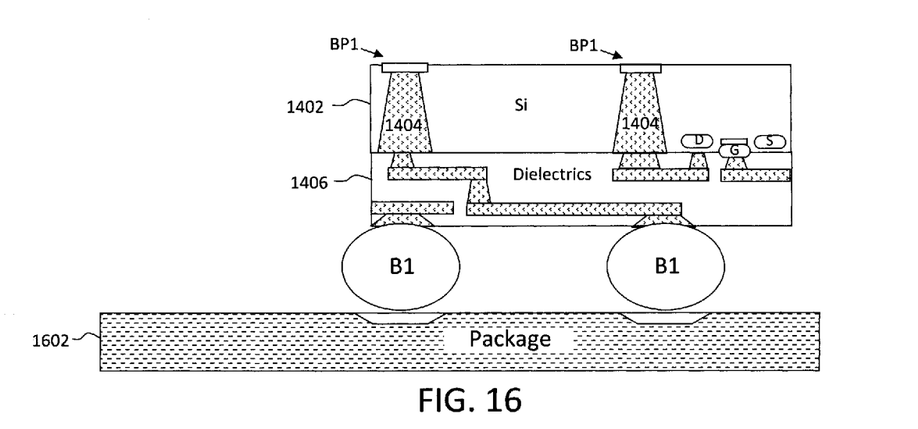
FIG. 16 is a cross-sectional diagram illustrating the TSV interposer chip having been joined to a package via the bump interconnect B1 according to an embodiment of the present invention.
Figure 17:
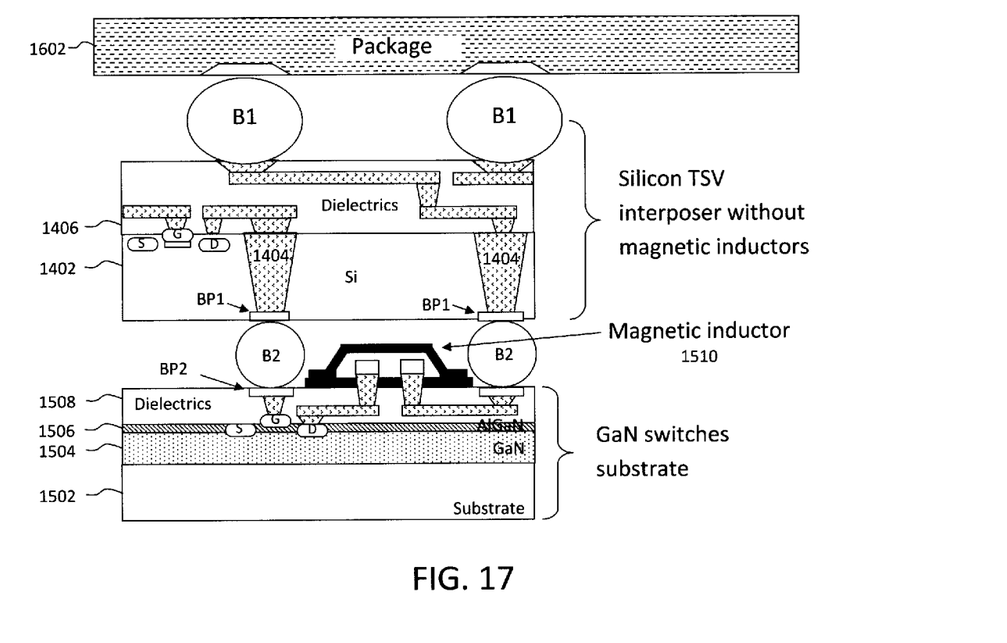
FIG. 17 is a cross-sectional diagram illustrating the TSV interposer chip/package having been joined to the GaN transistor chip via bump interconnects B2 according to an embodiment of the present invention.

A flip-chip process is then employed to 1) join the TSV interposer chip with a chip package, and 2) integrate the TSV interposer chip with the GaN transistor chip. Namely, as shown in FIG. 16, the TSV interposer chip is first joined to the package 1602 via the bump interconnect B1. By "flip-chip" it implies that the chip is flipped for bonding, e.g., back to back, front side to back, front to front, etc. to another chip or structure. Next, as shown in FIG. 17, the TSV interposer chip/package is then joined to the GaN transistor chip via bump interconnects B2.

Wafer bonding processes other than bump interconnect bonding can also be employed in accordance with the present techniques. For instance, according to a third exemplary embodiment of the present techniques, a metal-metal bonding interface between the bond pads BP1 (on the TSV interposer chip) to the second set of bond pads BP2 (on the GaN transistor chip) are used to join the chips together. See, for example, FIGS. 18-21. This example closely follows the first exemplary embodiment, and the same basic steps as above are performed to fabricate the TSV interposer chip and the GaN transistor chip. However, while the magnetic inductor (as in the first exemplary embodiment) is fabricated on the TSV interpose chip, here the magnetic inductor is formed on the TSV interposer chip after the wafer bonding to GaN transistor chip has been performed.

Figure 18:
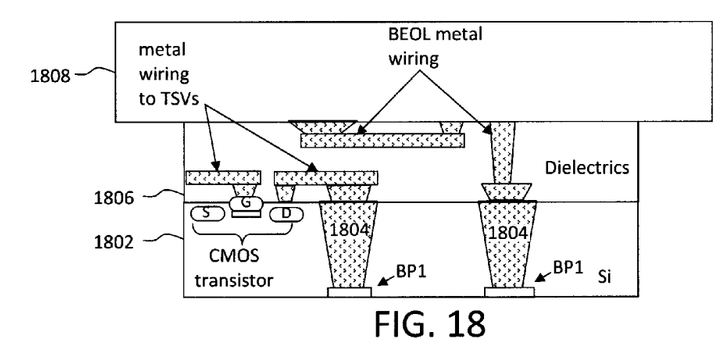
FIG. 18 is a cross-sectional diagram illustrating, according to yet another exemplary embodiment, a TSV interposer chip having been fabricated according to an embodiment of the present invention.

Namely, regarding the TSV interposer chip, as shown in FIG. 18, at least one CMOS transistor is fabricated on a Si substrate 1802 (using standard FEOL processes), and insulated TSVs 1804 are fabricated in the substrate 1802 adjacent to the CMOS transistor(s). The CMOS transistor(s) and TSVs are covered in a dielectric(s) 1806 and metal wiring is formed that connects the TSVs and the CMOS transistors. BEOL metal wiring is also formed at this stage.

In the same manner as described above, a temporary handle wafer 1808 is attached to a front side of the TSV interposer chip to permit back side processing of the TSV interposer chip enabling formation of a first set of bond pads (BP1) to the TSVs. In this case, however, instead of next applying a second temporary handle wafer (and removing the first handle wafer), here the first temporary handle wafer is left in place to facilitate backside metal-metal bonding of the TSV interposer chip to the GaN transistor chip (see below). By comparison with the bump interconnect example above (see, for example, the description of FIG. 8, above), the handle wafer is left in place because metal-metal bonding as in the present example is wafer-level process while solder bump bonding is die-level process. Wafers with TSVs are typically very thin and thus need handle wafer to do the wafer-level metal-metal bonding.

Figure 19:
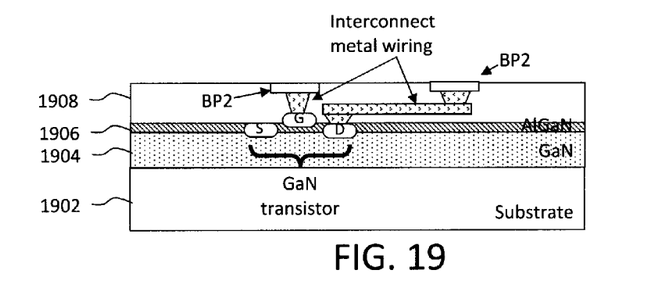
FIG. 19 is a cross-sectional diagram illustrating a GaN transistor chip having been fabricated according to an embodiment of the present invention.

Regarding the GaN transistor chip the process, as described in detail above, begins with a suitable substrate 1902 (e.g., Si (111), SiC, or sapphire) on which active layers such as a GaN layer 1904 and a higher band gap material 1906 (e.g., AlGaN) are deposited. See FIG. 19. As shown in FIG. 19, at least one GaN transistor is formed on the active layers.

The GaN transistor is covered in a dielectric(s) 1908 and interconnect metal wiring is formed to the GaN transistors. BEOL metal wiring is also formed. Finally, a second set of bond pads (BP2) are then formed to the interconnect metal wiring. A metal-metal bonding process between these bond pads BP2 and the bond pads BP1 (on the TSV interposer chip) will serve to join the TSV interposer chip and the GaN transistor chip.

Figure 20:
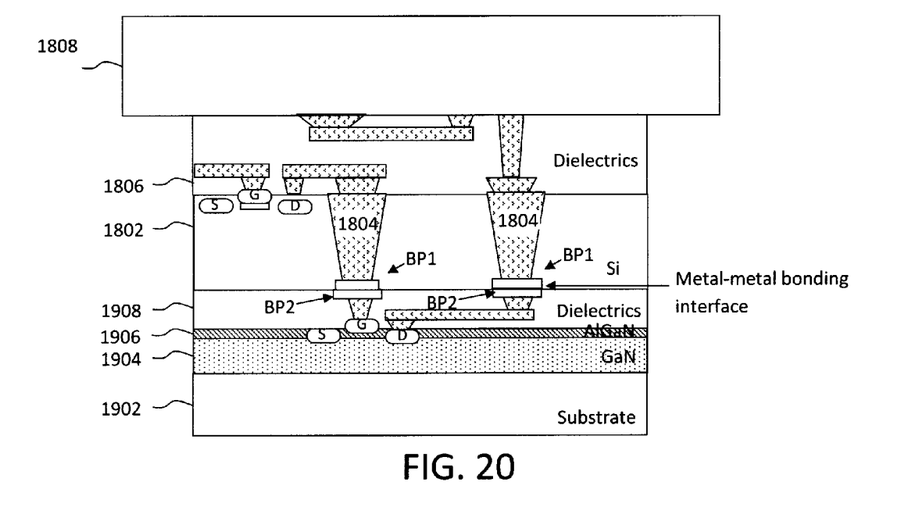
FIG. 20 is a cross-sectional diagram illustrating a metal-metal bond having been used to join the TSV interposer chip with the GaN transistor chip according to an embodiment of the present invention.

Namely, a flip-chip process is then employed to 1) integrate the TSV interposer chip with the GaN transistor chip via a metal-metal bonding between the bond pads BP1 on the TSV interposer chip and the bond pads BP2 on the GaN transistor chip, and 2) join the integrated TSV interposer chip/GaN transistor chip with a chip package. For instance, as shown in FIG. 20, a metal-metal bond between the bond pads BP1 on the TSV interposer chip and the bond pads BP2 on the GaN transistor chip is used to join the chips together. Cu—Cu bonds, for instance, can be formed using standard thermocompressive bonding tools and techniques known in the art. As provided above, the temporary handle wafer 1808 remains attached to the front side of the TSV interposer chip, and thus can be employed to facilitate this metal-metal bond between the chips.

Figure 21:
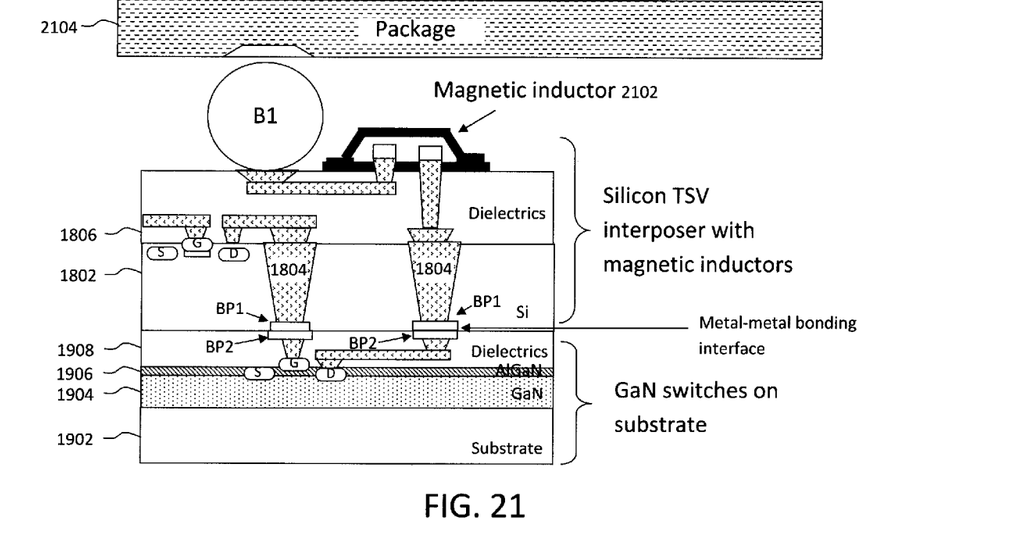
FIG. 21 is a cross-sectional diagram illustrating a magnetic inductor and bump interconnects having been built on a front side of the TSV interposer chip, and the integrated TSV interposer chip/GaN transistor chip having been bonded to a chip package according to an embodiment of the present invention.

Following bonding of the TSV interposer chip with the GaN transistor chip, the temporary handle wafer 1808 can be removed. Removal of temporary handle wafer 1808 permits formation of a (e.g., closed-yoke) magnetic inductor 2102 for the integrated DC-DC power converter and bump interconnects (B1) to be built on a front side of the TSV interposer chip. See FIG. 21. As shown in FIG. 21, the integrated TSV interpose chip/GaN transistor chip can then be bonded, via the bump interconnects B1, to a chip package 2104.

In the context of metal-metal bonding, the magnetic inductor can instead be built on the GaN transistor chip (rather than on the TSV interposer chip). For instance, according to a fourth exemplary embodiment of the present techniques, a metal-metal bonding interface between the bond pads BP1 (on the TSV interposer chip) to the second set of bond pads BP2 (on the GaN transistor chip) are used to join the chips together after the magnetic inductors have been built in a planar dielectric on the GaN transistor chip. See, for example, FIGS. 22-25. This example closely follows the second exemplary embodiment, and the same basic steps as above are performed to fabricate the TSV interposer chip and the GaN transistor chip. However, an additional dielectric (and associated metallization) is needed on the front side of the GaN transistor chip to permit space for the magnetic inductor while at the same time permitting metal-metal bonding between the chips.

Figure 22:
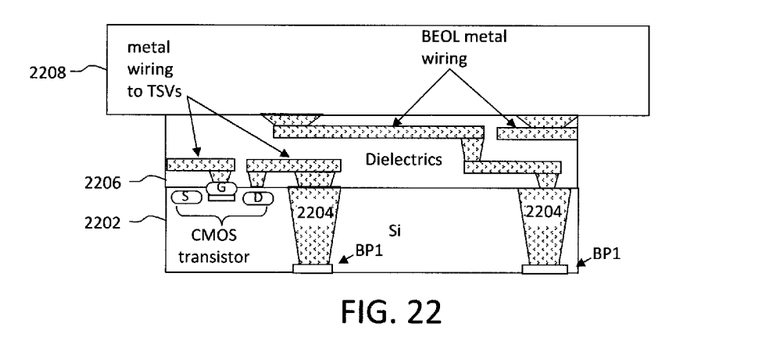
FIG. 22 is a cross-sectional diagram illustrating, according to still yet another exemplary embodiment, a TSV interposer chip having been fabricated according to an embodiment of the present invention.

Namely, regarding the TSV interposer chip, as shown in FIG. 22, at least one CMOS transistor is fabricated on a Si substrate 2202 (using standard FEOL processes), and insulated TSVs 2204 are fabricated in the substrate 2202 adjacent to the CMOS transistor(s). The CMOS transistor(s) and TSVs are covered in a dielectric(s) 2206 and metal wiring is formed that connects the TSVs and the CMOS transistors. BEOL metal wiring is also formed at this stage.

In the same manner as described above, a temporary handle wafer 2208 is attached to a front side of the TSV interposer chip to permit back side processing of the TSV interposer chip enabling formation of a first set of bond pads (BP1) to the TSVs. In this case, however, instead of next applying a second temporary handle wafer (and removing the first handle wafer), here the first temporary handle wafer is left in place to facilitate backside metal-metal bonding of the TSV interposer chip to the GaN transistor chip (see below).

Figure 23:
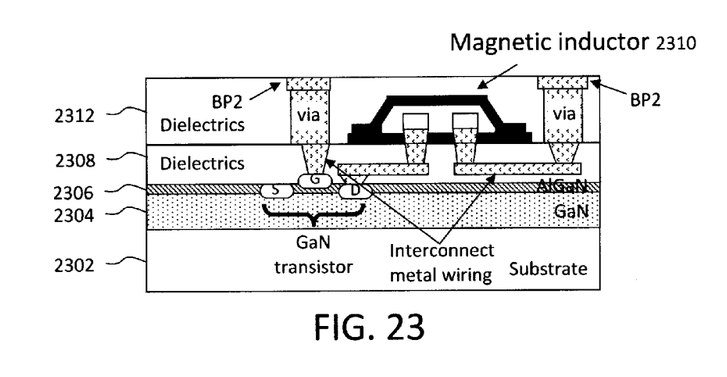
FIG. 23 is a cross-sectional diagram illustrating a GaN transistor chip having been fabricated according to an embodiment of the present invention.

Regarding the GaN transistor chip the process, as described in detail above, begins with a suitable substrate 2302 (e.g., Si (111), SiC, or sapphire) on which active layers such as a GaN layer 2304 and a higher band gap material 2306 (e.g., AlGaN) are deposited. See FIG. 23. As shown in FIG. 23, at least one GaN transistor is formed on the active layers.

The GaN transistor is covered in a dielectric(s) 2308 and interconnect metal wiring is formed to the GaN transistors. BEOL metal wiring is also formed.

Next, a (e.g., closed-yoke) magnetic inductor 2310 for the integrated DC-DC power converter is built on a front side of the GaN transistor chip. As shown in FIG. 23, a dielectric 2312 is deposited onto the front side of the GaN transistor chip, burying the magnetic inductor 2310. If necessary, the dielectric 2312 can be planarized using a process such as chemical mechanical polishing (CMP). A second set of bond pads (BP2) are then formed which are connected to the interconnect metal wiring by way of vias through the dielectric 2312. A metal-metal bonding process between these bond pads BP2 and the bond pads BP1 (on the TSV interposer chip) will serve to join the TSV interposer chip and the GaN transistor chip.

Figure 24:
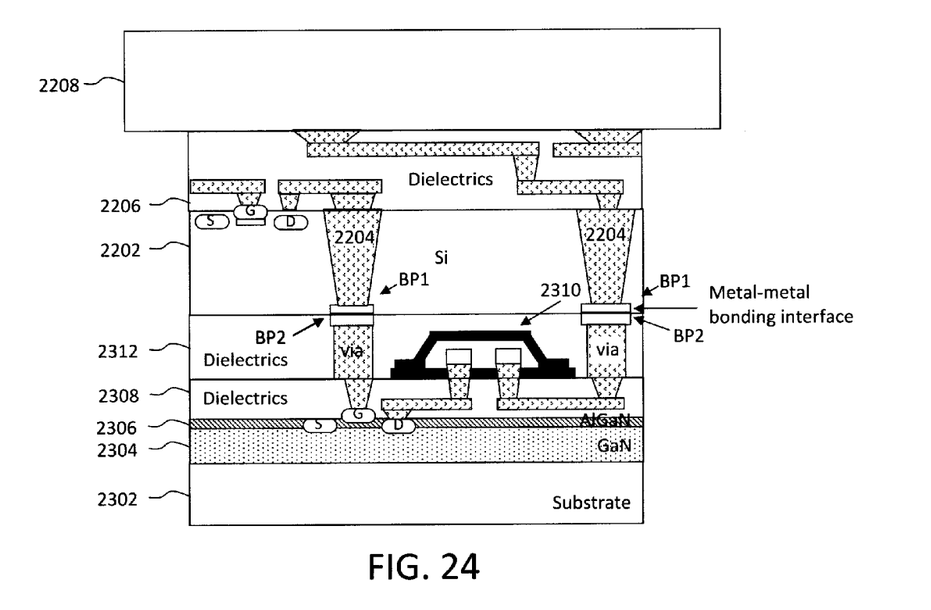
FIG. 24 is a cross-sectional diagram illustrating a metal-metal bond having been used to join the TSV interposer chip with the GaN transistor chip according to an embodiment of the present invention.
Figure 25:
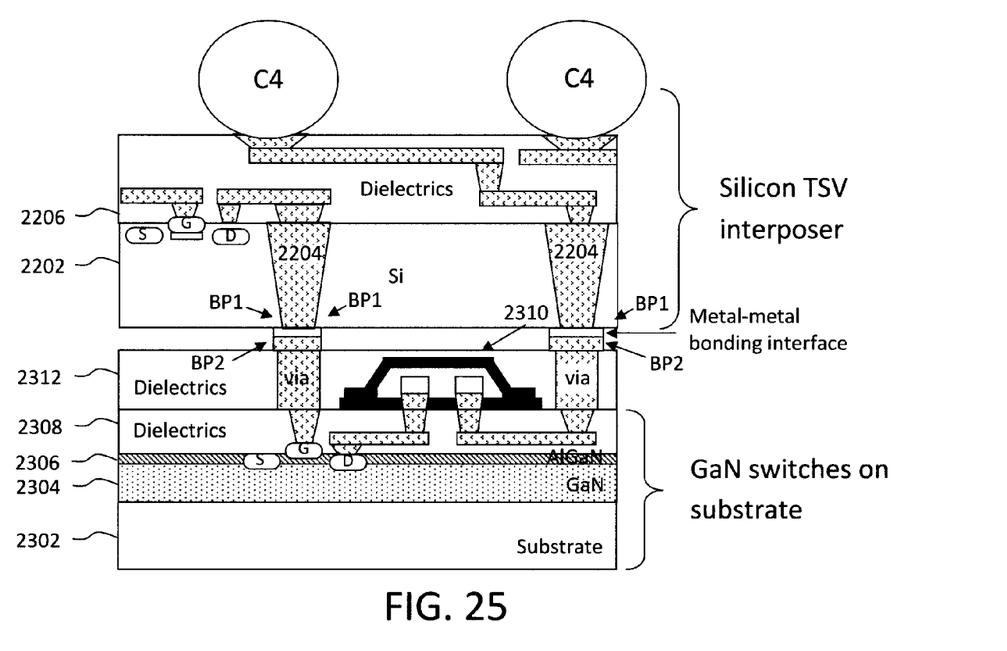
FIG. 25 is a cross-sectional diagram illustrating bump interconnects having been built on a front side of the TSV interposer chip according to an embodiment of the present invention.

Namely, a flip-chip process is then employed to 1) integrate the TSV interposer chip with the GaN transistor chip via a metal-metal bonding between the bond pads BP1 on the TSV interposer chip and the bond pads BP2 on the GaN transistor chip, and 2) join the integrated TSV interposer chip/GaN transistor chip with a chip package. For instance, as shown in FIG. 24, a metal-metal bond between the bond pads BP1 on the TSV interposer chip and the bond pads BP2 on the GaN transistor chip is used to join the chips together (e.g., via thermocompressive bonding). As provided above, the temporary handle wafer 2208 remains attached to the front side of the TSV interposer chip, and thus can be employed to facilitate this metal-metal bond between the chips.

Following bonding of the TSV interposer chip with the GaN transistor chip, the temporary handle wafer 2208 can be removed. Removal of temporary handle wafer 2208 permits formation of bump interconnects (C4) to be built on a front side of the TSV interposer chip. See FIG. 25. The term C4 denotes solder bumps. The bump interconnects B1 and B2 mentioned above can be C4 solder bumps. However, B1 and B2 can also be micro-bumps which are basically smaller solder bumps with a denser pitch. While not explicitly shown in FIG. 25, the integrated TSV interpose chip/GaN transistor chip can then be bonded, via the bump interconnects C4, to a chip package in the same manner as described above.

Figure 26:
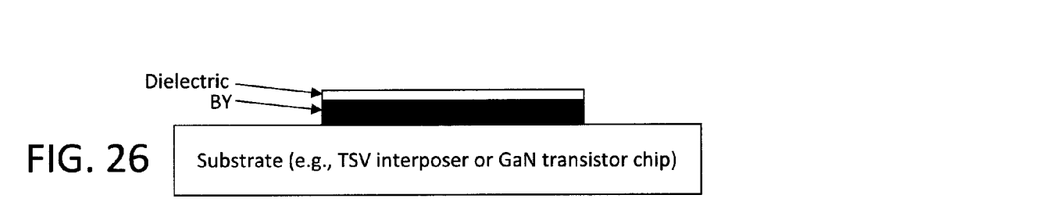
FIG. 26 is a cross-sectional diagram illustrating a starting structure for fabricating a magnetic inductor on the TSV interposer or GaN transistor chip, which includes a bottom yolk (BY) and a dielectric over the BY according to an embodiment of the present invention.
Figure 27:
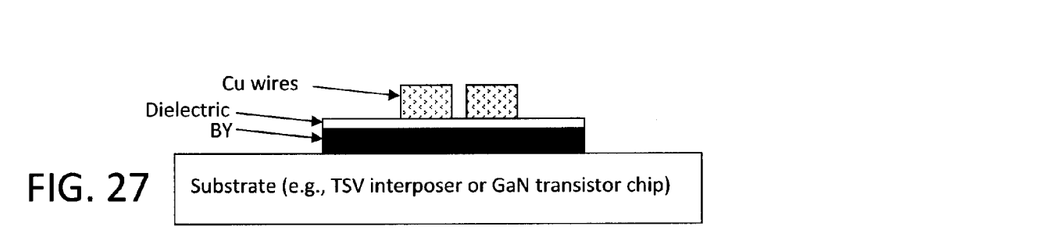
FIG. 27 is a cross-sectional diagram illustrating Cu wires having been plated onto the dielectric according to an embodiment of the present invention.

An exemplary methodology for fabricating a closed-yoke magnetic inductor is now provided by way of reference to FIGS. 26-29. In the above examples, the magnetic inductor was formed on either the TSV interposer chip or the GaN transistor chip. Thus, either of these chips are represented generically in FIGS. 26-29 as a substrate on which the magnetic inductor is built. As shown in FIG. 26, a film of a magnetic material is formed on the substrate. This film will be used to form the bottom yolk or BY. See FIG. 26. Suitable magnetic materials for the bottom (and top) yolk include, but are not limited to, iron (Fe)-based materials, such as iron-tantalum nitride (FeTaN), iron-hafnium oxide (FeHfO), iron-chromium hafnium nitride (FeCrHfN), iron-chromium tantalum nitride (FeCrTaN), iron-chromium nitride (FeCrN), iron-cobalt boron (FeCoB), and combinations thereof. See, for example, Zhuang et al., "Study of Magnetic On-Chip Inductors," Proc. SAFE 2001, Nov. 28-29, 2001, Veldhoven, the Netherlands, pp. 229-233, the contents of which are incorporated by reference as if fully set forth herein. Magnetic materials for the bottom yolk can be deposited onto the substrate using a technique such as sputtering. After deposition, the magnetic film for the bottom yolk is patterned using standard lithography and etching techniques into the footprint and location of the magnetic inductor. See FIG. 26. A dielectric is then deposited onto the bottom yolk BY.

Cu wires are then plated onto the dielectric. See FIG. 27. By way of example only, a standard resist mask plating technique can be used to form the Cu wires, wherein a conventional photolithography and etching process is used to pattern a photoresist (not shown) on the dielectric with the footprint and location of the Cu wires. The photoresist pattern is coated with a thin Cu seed layer (not shown), e.g., by sputtering, which is needed to enable plating of the Cu wires. The pattern is then filled with plated Cu to form the Cu wires, followed by removal of the photoresist and seed Cu layer.

Figure 28:
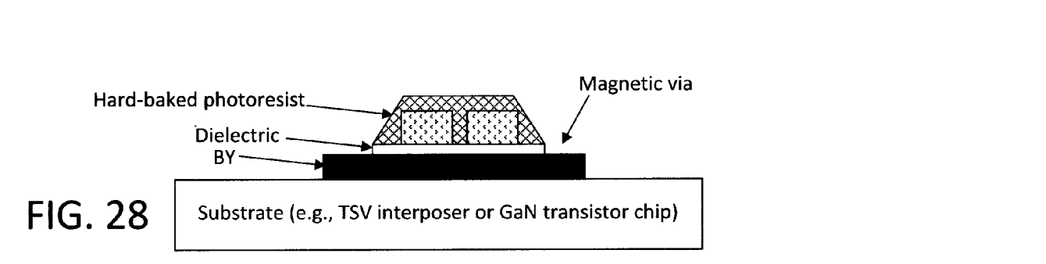
FIG. 28 is a cross-sectional diagram illustrating the Cu wires having been covered with a hard baked photoresist, and magnetic vias having been opened to the BY according to an embodiment of the present invention.
Figure 29:
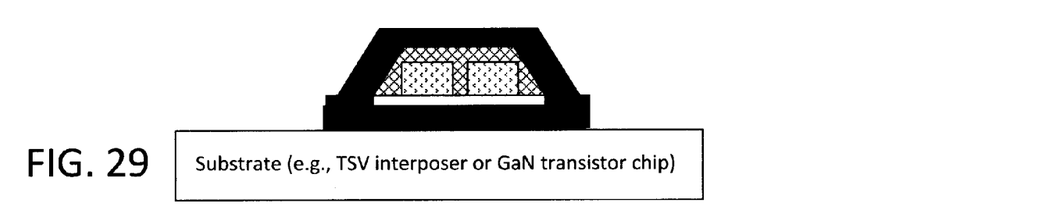
FIG. 29 is a cross-sectional diagram illustrating a top yolk TY of the magnetic inductor having been formed according to an embodiment of the present invention.

As shown in FIG. 28, the Cu wires are then covered with a patterned (e.g., hard baked) photoresist which is then used as a mask to open up the dielectric, forming magnetic vias to the bottom yolk BY. In the same manner as described above for the bottom yolk BY, a suitable magnetic material (see above) is deposited and patterned to form the top yolk (TY) of the magnetic inductor. See FIG. 29.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a fully integrated DC-DC power converter, the method comprising the steps of:
   forming at least one power driver transistor on an interposer chip;
   forming TSVs in the interposer chip adjacent to the power driver transistor;
   forming at least one GaN switch on a GaN transistor chip;
   forming an on-chip magnetic inductor either on the GaN transistor chip or on the interposer chip; and
   bonding the interposer chip to the GaN transistor chip.

2. The method of claim 1, further comprising the steps of:
   attaching a temporary handle wafer to a front side of the interposer chip;
   exposing the TSVs from the back side of the interposer chip; and
   forming at least one first set of bond pads connected to the TSVs on the back side of the interposer chip.

3. The method of claim 2, wherein the GaN transistor chip comprises a substrate and an active layer on the substrate, the method further comprising the steps of:
   forming the GaN switch in the active layer;
   depositing a dielectric on the active layer; and forming metal wiring in the dielectric that connects the GaN switch to at least one second set of bond pads.

4. The method of claim 3, wherein the active layer comprises a first active material on the substrate and a second active material on the first active material, wherein the first active material comprises GaN, and wherein the second active material has a higher band gap than the first active material.

5. The method of claim 4, wherein the second active material comprises AlGaN.

6. The method of claim 3, further comprising the step of:
bonding the interposer chip to the GaN transistor chip via metal-metal bonding between the first set of bond pads and the second set of bond pads.

7. The method of claim 3, further comprising the step of:
bonding the interposer chip to the GaN transistor chip via bump interconnects between the first set of bond pads and the second set of bond pads.

8. The method of claim 3, further comprising the step of:
forming the on-chip magnetic inductor on the dielectric.

9. The method of claim 8, further comprising the steps of:
burying the on-chip magnetic inductor in another dielectric; and
forming vias in the other dielectric that connect the metal wiring to the second set of bond pads.

10. The method of claim 1, wherein the interposer chip comprises a substrate, the method further comprising the steps of:
forming the power driver transistor on the substrate;
forming the TSVs in the substrate;
depositing a dielectric on the substrate;
forming metal wiring in the dielectric that connects the power driver transistor to the TSVs; and
forming the on-chip magnetic inductor on the dielectric.

* * * * *